(12) United States Patent
Kim et al.

(10) Patent No.: US 7,700,960 B2
(45) Date of Patent: Apr. 20, 2010

(54) LIGHT EMITTING DIODE WITH ITO LAYER AND METHOD FOR FABRICATING THE SAME

(75) Inventors: Dae Won Kim, Seoul (KR); Yeo Jin Yoon, Ansan-si (KR); Duck Hwan Oh, Suwon-si (KR); Jong Hwan Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/605,146

(22) Filed: Oct. 23, 2009

(65) Prior Publication Data

US 2010/0032694 A1 Feb. 11, 2010

Related U.S. Application Data

(63) Continuation of application No. 12/088,902, filed as application No. PCT/KR2006/005352 on Dec. 8, 2006.

(30) Foreign Application Priority Data

Jan. 9, 2006 (KR) .................. 10-2006-0002421
Mar. 14, 2006 (KR) .................. 10-2006-0023612

(51) Int. Cl.
*H01L 33/00* (2006.01)
*H01L 27/15* (2006.01)

(52) U.S. Cl. .................. 257/88; 257/72; 257/79; 257/91; 257/93; 257/94; 257/95; 257/E31.099; 257/E31.105; 257/E31.126; 257/E33.001; 438/39; 438/66; 438/80; 438/82; 438/89; 315/122; 315/125; 315/145; 315/147; 315/310

(58) Field of Classification Search .................. 257/72, 257/79, 91, 93, 94, 95, E31.099, E31.105, 257/E31.126, E33.001; 438/39, 66, 80, 82, 438/89; 315/122, 125, 145, 147
See application file for complete search history.

(56) References Cited

U.S. PATENT DOCUMENTS 6,472,718 B2   10/2002   Lell (Continued)

FOREIGN PATENT DOCUMENTS

JP   09-283801   10/1997

(Continued)

OTHER PUBLICATIONS

German Office Action dated Dec. 15, 2008.

*Primary Examiner*—Dao H Nguyen
(74) *Attorney, Agent, or Firm*—H.C. Park & Associates, PLC

(57) ABSTRACT

The present invention relates to a light emitting diode with enhanced luminance and light emitting performance due to increase in efficiency of current diffusion into an ITO layer, and a method of fabricating the light emitting diode. According to the present invention, there is manufactured at least one light emitting cell including an N-type semiconductor layer, an active layer and a P-type semiconductor layer on a substrate. The method of the present invention comprises the steps of (a) forming at least one light emitting cell with an ITO layer formed on a top surface of the P-type semiconductor layer; (b) forming a contact groove for wiring connection in the ITO layer through dry etching; and (c) filling the contact groove with a contact connection portion made of a conductive material for the wiring connection.

12 Claims, 8 Drawing Sheets

U.S. PATENT DOCUMENTS

| | | |
|---|---|---|
| 6,547,249 B2 | 4/2003 | Collins et al. |
| 6,635,902 B1 | 10/2003 | Lin |
| 6,703,284 B2 * | 3/2004 | Barkhordarian ............. 438/328 |
| 6,838,710 B1 * | 1/2005 | Barkhordarian ............. 257/199 |
| 6,957,899 B2 | 10/2005 | Jiang et al. |
| 7,034,340 B2 * | 4/2006 | Yukimoto .................... 257/88 |
| 7,095,050 B2 * | 8/2006 | Wanlass et al. .............. 257/79 |
| 7,132,691 B1 | 11/2006 | Tanabe et al. |
| 7,210,819 B2 | 5/2007 | Jiang et al. |
| 7,213,942 B2 | 5/2007 | Jiang et al. |
| 7,221,044 B2 | 5/2007 | Fan et al. |
| 7,271,421 B2 | 9/2007 | Yukimoto et al. |
| 7,317,211 B2 | 1/2008 | Watanabe et al. |
| 7,474,681 B2 | 1/2009 | Lin et al. |
| 7,511,311 B2 | 3/2009 | Kususe et al. |
| 7,525,248 B1 | 4/2009 | Fan |
| 7,535,028 B2 | 5/2009 | Fan et al. |
| 2005/0199885 A1 | 9/2005 | Hata et al. |
| 2005/0224973 A1 | 10/2005 | Bernier et al. |
| 2005/0225973 A1 | 10/2005 | Eliashevich et al. |
| 2006/0043433 A1 | 3/2006 | Matsushita |
| 2006/0044864 A1 | 3/2006 | Lin et al. |
| 2007/0090377 A1 | 4/2007 | Lin et al. |
| 2007/0284598 A1 | 12/2007 | Shakuda et al. |
| 2008/0230765 A1 | 9/2008 | Yoon et al. |
| 2008/0251796 A1 | 10/2008 | Lee et al. |
| 2009/0039359 A1 | 2/2009 | Yoon et al. |

FOREIGN PATENT DOCUMENTS

| | | |
|---|---|---|
| JP | 11-150303 | 6/1999 |
| JP | 11-312824 | 11/1999 |
| JP | 2001-257380 | 9/2001 |
| JP | 2005-303295 | 10/2005 |
| JP | 2009-522803 | 6/2009 |
| KR | 2001-0088929 | 9/2001 |
| KR | 2005-0014343 | 2/2005 |
| WO | 02-09185 | 1/2002 |
| WO | 02-09200 | 1/2002 |
| WO | 2004-013916 | 2/2004 |
| WO | 2004-023568 | 3/2004 |
| WO | 2008-111693 | 9/2008 |

* cited by examiner

LIGHT EMITTING DIODE WITH ITO LAYER AND METHOD FOR FABRICATING THE SAME

CROSS REFERENCE RELATED APPLICATIONS

This application is a continuation application of U.S. patent application Ser. No. 12/088,902, filed on Apr. 1, 2008, which is the National Stage of International Application No. PCT/KR2006/005352, filed Dec. 8, 2006, and claims priority from and the benefit of Korean Patent Application No. 10-2006-0002421, filed on Jan. 9, 2006, and Korean Patent Application No. 10-2006-0023612, filed Mar. 14, 2006, which are all hereby incorporated by reference for all purposes as if fully set forth herein.

BACKGROUND OF THE INVENTION

1. Field of the Invention

The present invention relates to a light emitting diode with a transparent ITO layer as an electrode layer and a method of fabricating the light emitting diode, and more particularly, to a light emitting diode with enhanced luminance and light emitting performance due to increase in efficiency of current diffusion into an ITO layer, and a method of fabricating the light emitting diode.

2. Discussion of the Background

A light emitting diode is a photoelectric conversion device having a structure in which an N-type semiconductor and a P-type semiconductor are joined together, and emits light through recombination of electrons and holes. As an example, a GaN based light emitting diode has been known as such a light emitting diode. A GaN based light emitting diode comprises light emitting cells each having an N-type semiconductor layer, an active layer (or a light emitting layer) and a P-type semiconductor layer which are made of GaN based materials and sequentially formed on a substrate made of sapphire, silicon or the like.

In general, a light emitting cell is configured in such a manner that an etching process is performed from a P-type semiconductor layer to an N-type semiconductor layer to allow a portion of the N-type semiconductor layer to be exposed to the outside, and electrode structures or electrical contact structures for current application are formed on top surfaces of the P-type semiconductor layer and the N-type semiconductor layer exposed to the outside.

Particularly, since a light emitting region through which light is emitted is formed on top of the P-type semiconductor layer, a transparent electrode layer through which the emission of light is not prevented is required. A Ni/Au layer with a superior electrical property has been employed as such a transparent electrode layer. However, since the Ni/Au layer has very low transmittance for visible light in spite of the superior electrical property, there is a problem in that the light emitting efficiency of a light emitting diode is lowered.

Therefore, there has been suggested a technology in which an ITO (Indium Tin Oxide) layer with a tunnel structure applied thereto for forming an ohmic contact is used as a transparent electrode layer on a P-type semiconductor layer instead of a Ni/Au layer. There is an advantage in that the ITO layer has an excellent transmittance of 90% or more for visible light. However, a further improvement has been required in that the ITO layer has a low electrical property as compared with the existing Ni/Au layer. Particularly, many studies for enhancing a current property between an ITO layer and a contact connection portion such as a contact pad or an end of a wiring have been conducted in the art.

SUMMARY OF THE INVENTION

In the aforementioned light emitting diode, improvement in light transmittance and current property of a transparent electrode layer formed on a light emission surface of each light emitting cell should be deeply considered. Therefore, the present invention proposes a light emitting diode in which an ITO layer with superior light transmittance is used as the transparent electrode layer but a current property considered as a problem in the ITO layer is enhanced.

Accordingly, an object of the present invention is to provide a light emitting diode with greatly enhanced luminance and light emitting performance due to the increase in efficiency of current diffusion into an ITO layer on a P-type semiconductor layer, and a method of fabricating the light emitting diode.

According to an aspect of the present invention, there is provided a method of fabricating a light emitting diode formed with at least one light emitting cell including an N-type semiconductor layer, an active layer and a P-type semiconductor layer on a substrate. The method of fabricating a light emitting diode comprises the steps of (a) forming at least one light emitting cell with an ITO layer formed on a top surface of the P-type semiconductor layer; (b) forming a contact groove for wiring connection in the ITO layer through dry etching; and (c) filling the contact groove with a contact connection portion made of a conductive material for the wiring connection.

Preferably, the step (b) comprises a dry etching process of etching a portion of the ITO layer by causing inert gas to collide against the ITO layer, through the etching process, a surface of the P-type semiconductor layer being exposed to the outside and a current blocking layer being formed on the surface of the P-type semiconductor layer against which the inert gas collide.

The method of the present invention may further comprise the step of, prior to the step (c), exposing a portion of the N-type semiconductor layer as a contact region and then forming an N-type contact pad on the contact region.

The contact connection portion filled in the contact groove in step (c) may a P-type contact pad of which lower portion is brought into contact with an inner circumferential surface of the ITO layer inside of the contact groove and upper portion is brought into contact with a top surface of the ITO layer outside of the contact groove.

At least one light emitting cell may be a plurality of light emitting cells spaced apart from one another, and the step (a) may further comprise the step of exposing a portion of the N-type semiconductor layer of each of the light emitting cells as a contact region on which an N-type contact pad is formed.

Preferably, the step (c) further comprises the step of forming a wiring made of a conductive material layer through a plating or vapor depositing method for electrical connection between the adjacent light emitting cells, and the contact connection portion is formed of a portion of the conductive material layer. At this time, the step (b) comprises the steps of (b-1) forming a transparent insulation layer entirely covering the light emitting cell formed in step (a) on the substrate, and (b-2) patterning and etching the transparent insulation layer to expose a portion through which the wiring is connected, and simultaneously to form the contact groove of the ITO layer.

More preferably, the step (c) comprises the steps of (c1) forming a conductive material layer through a plating or vapor depositing method to entirely cover the light emitting cell with the transparent insulation layer formed thereon and the substrate, and (c2) etching and removing a portion of the conductive material layer other than extending from the contact groove of the light emitting cell to the N-type contact pad of the adjacent light emitting cell while causing the other portion of the conductive material layer to function as the wiring.

According to the another aspect of the present invention, there is provided a light emitting diode with an ITO layer, comprising a substrate; at least one light emitting cell sequentially formed with an N-type semiconductor layer, an active layer and a P-type semiconductor layer on the substrate, and including an ITO layer formed on a top surface of the P-type semiconductor layer; a contact groove formed in the ITO layer for wiring connection; and a contact connection portion filled in the contact groove at one end of a wiring.

According to a structure in which a contact connection portion, i.e. an end of a wiring, or a P-type contact pad at an end of a wiring is brought into contact with an inner circumferential surface of a contact groove formed in an ITO layer, efficiency of current diffusion into an ITO layer on a P-type semiconductor layer can be enhanced without reducing a light emitting area of the ITO layer. Therefore, a light emitting diode with greatly improved luminance and light emitting performance can be implemented.

In a light emitting diode including a P-type contact pad as a contact connection portion according to an embodiment of the present invention, the P-type contact pad can simultaneously come into contact with a top surface of the ITO layer and the inner circumferential surface of the ITO layer. Consequently, a contact area between the ITO layer and the P-type contact pad is further increased such that the efficiency of current diffusion into the ITO layer can be enhanced.

For example, in a light emitting diode including a plurality of light emitting cells according to another embodiment of the present invention similar to an AC light emitting diode operated by an AC power source, a wiring may comprise a conductive material layer formed through a plating or vapor depositing process such that wiring disconnection and the like can be prevented. At this time, since the contact connection portion formed of a portion of the conductive material layer comes into contact with the inner circumferential surface of the contact groove of the ITO layer, the efficiency of current diffusion into the ITO layer can be enhanced.

Further, according to the embodiments of the present invention, a current blocking layer formed due to change in a current property of a portion of a P-type semiconductor layer during a dry etching process may be formed at a position where the P-type semiconductor layer is brought into contact with the contact connection portion. Therefore, the current blocking layer can completely block current from flowing directly into the P-type semiconductor layer to contribute in enhancing the efficiency of current diffusion into the ITO layer.

DETAILED DESCRIPTION OF THE ILLUSTRATED EMBODIMENTS

Figure 1:
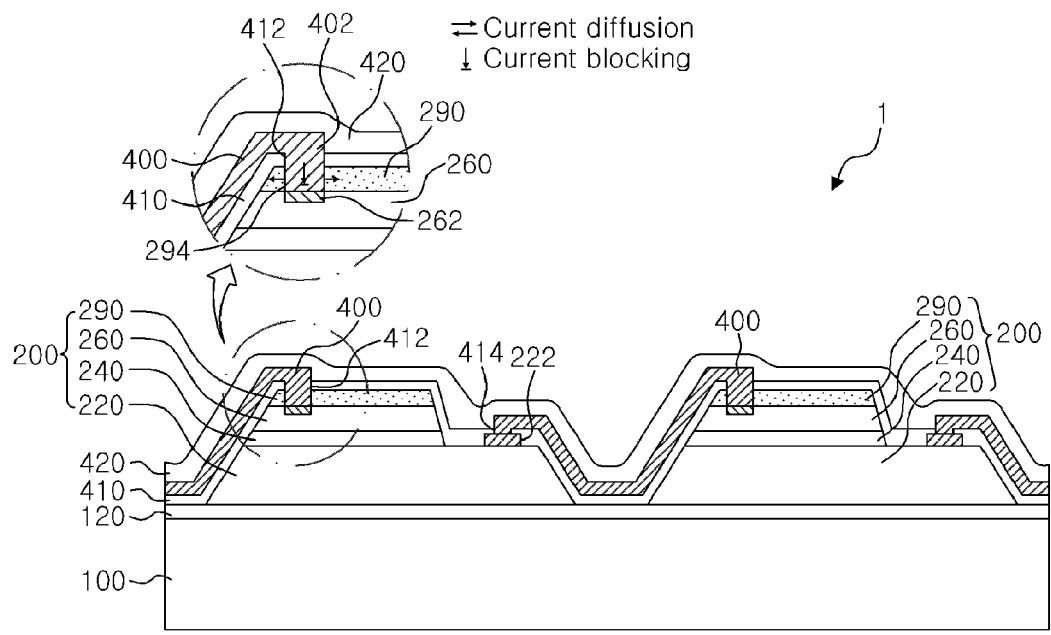
FIG. 1 is a sectional view showing a light emitting diode according to a first embodiment of the present invention.

Hereinafter, preferred embodiments of the present invention will be described in detail with reference to the accompanying drawings. The following embodiments are provided only for illustrative purposes to fully convey the scope of the present invention to those skilled in the art. Therefore, the present invention is not limited to the embodiments set forth herein but can be implemented in different forms. In the drawings, the widths, lengths, thicknesses and the like of components may be exaggerated for convenience of illustration. Like reference numerals indicate like elements throughout the specification and drawings.

FIG. 1 is a sectional view showing a light emitting diode according to a first embodiment of the present invention.

A light emitting diode 1 according to the first embodiment of the present invention is an AC light emitting diode operating under AC conditions. A conventional AC light emitting diode operated by an AC power source has been disclosed in PCT Publication No. WO 2004/023568 A1 entitled "Light-emitting device having light emitting element" by Sakai, et al.

Referring to FIG. 1, the light emitting diode 1 according to this embodiment comprises a substrate 100 serving as a base and a plurality of light emitting cells 200. The substrate 100 may be an insulating or conductive substrate. Although a sapphire substrate is used in this embodiment, another substrate such as SiC may be utilized.

Further, a buffer layer 120 for reducing lattice mismatch between lower layers of the light emitting cells 200 and the substrate 100 may be interposed between the substrate 100 and the light emitting cells 200. In a case where the substrate 100 is an insulating substrate made of sapphire as in this embodiment, the buffer layer 120 may be formed of a conductive material. In this case, the buffer layers 120 corresponding to the respective light emitting cells 200 are spaced apart from one another to allow the light emitting cells 120 to be electrically isolated from one another. Meanwhile, assuming that the substrate 100 is a conductive substrate, the buffer layer 120 is formed of an insulating or semi-insulating material to electrically isolate the substrate 100 and the light emitting cells 200. For example, nitride such as AlN or GaN is frequently used as the buffer layer 120.

As described above, the plurality of light emitting cells 200 are formed on the substrate 100. Each of the plurality of light emitting cells 200 has such a structure in which an N-type semiconductor layer 220, an active layer 240 and a P-type semiconductor layer 260 are sequentially laminated. As shown in this figure, the active layer 240 is restrictively formed on a certain region of the N-type semiconductor layer 220 through the aforementioned mesa formation, and the P-type semiconductor layer 260 is then formed on the active layer 240. Thus, the active layer 240 is bonded on a certain region on a top surface of the N-type semiconductor layer 220, and the rest of the top surface of the layer is exposed to the outside by partially removing the P-type semiconductor layer 260 and the active layer 240 as described above.

In the embodiment of the present invention, electrode structures for applying a current to the light emitting diode 1 are respectively provided on the P-type and N-type semiconductor layers 260 and 220 of each of the light emitting cells 200. Particularly, careful consideration for light transmittance and electrical property should be made for the electrode structure on the P-type semiconductor layer 260. An ITO layer 290 made of indium tin oxide in consideration of the aforementioned light transmittance and electrical property is formed as a transparent electrode layer on a top surface of the P-type semiconductor layer 260. In the specification, the term light emitting cell is defined as including the ITO layer 290 together with the N-type semiconductor layer 220, the active layer 240 and the P-type semiconductor layer 260.

Components of each of the light emitting cells 200 will be described below in more detail. The N-type semiconductor layer 220 may be formed of N-type $Al_xIn_yGa_{1-x-y}N$ ($0 \leqq x$, $y$, $x+y \leqq 1$) and include an N-type clad layer. Further, the P-type semiconductor layer 260 may be formed of P-type $Al_xIn_yGa_{1-x-y}N$ ($0 \leqq x$, $y$, $x+y \leqq 1$) and include a P-type clad layer. The N-type semiconductor layer 220 may be doped with Si and the P-type semiconductor layer 260 may be doped with Zn or Mg.

Further, the active layer 240 is a region where electrons and holes are recombined. The active layer comprises InGaN. The wavelength of light emitted from a light emitting cell varies according to the kind of a material constituting the active layer 240. The active layer 240 may be a multilayer film in which quantum well layers and barrier layers are alternately formed. The quantum well layer and barrier layer may be binary to quaternary compound semiconductor layers expressed as a general formula of $Al_xIn_yGa_{1-x-y}N$ ($0 \leqq x$, $y$, $x+y \leqq 1$).

Further, since the aforementioned ITO layer 290 has high transmittance of 90% or more for visible light, it contributes to the enhancement of the light emitting efficiency of the respective light emitting cells 200 and thus the light emitting diode 1. At this time, an ohmic contact between the ITO layer 290 and the P-type semiconductor layer 260 cannot be well formed in that the ITO layer 290 is of an N-type. However, if a tunnel structure for forming an ohmic contact between the ITO layer 290 and the P-type semiconductor layer 260 is employed, the ohmic contact between the two layers can be well formed. Although not illustrated in this figure, the tunnel structure may be formed by introducing indium (In) or N-type dopant between the P-type semiconductor layer 260 and the ITO layer 290 in a delta doping method.

As shown in an enlarged portion of FIG. 1, a contact groove 294 for connecting with an end of a wiring 400 is formed on a top surface of the ITO layer 290. The contact groove 294 is formed at a predetermined depth through a dry etching process and is filled with the end of the wiring 400 formed of a conductive material layer. The contact groove 294 can minimize the reduction of a light emitting area of the ITO layer 290 and increase the contact area between the ITO layer 290 and the wiring 400 such that the efficiency of current diffusion into the ITO layer 290 through the wiring 400 can be enhanced, as more clearly understood from the following descriptions. At this time, since the end of the wiring 400 filled in the contact groove 294 corresponds to a portion through which the wiring 400 and the ITO layer 290 are electrically connected with each other, it is defined as a "contact connection portion 402" in this embodiment.

According to this embodiment of the present invention, the contact groove 294 extends from the ITO layer 290 to the surface of the P-type semiconductor layer 260. Further, the contact groove 294 is filled with the contact connection portion 402 at an end of the wiring 400 formed through a plating or vapor depositing method, for example. Furthermore, the contact connection portion 402 filled in the contact groove 294 is brought into contact with the surface of the P-type semiconductor layer 260 exposed through the contact groove 294 and brought into close contact with an inner circumferential surface of the contact groove 294 within the contact groove 294. At this time, the wiring 400 is formed of only a conductive material layer entirely formed through a plating or vapor depositing method. However, in a case where the wiring is used in the form of an air bridge wiring which floats over a light emitting cell, the contact connection portion 402 filled in the contact groove 294 may be a P-type contact pad (or electrode pad).

In a state where the contact connection portion 402 of the wiring 400 is filled in the contact groove 294 of the light emitting cell 200, the other end of the wiring 400 is connected to a contact region on the N-type semiconductor layer 220 of another adjacent light emitting cell 200. An N-type contact pad 222 bonded directly to the wiring 400 is formed on the contact region.

Further, the wiring 400 is electrically isolated from the surfaces of the light emitting cells 200 by a transparent insulation layer 410. The transparent insulation layer 410 is formed to entirely cover the surfaces of the light emitting cells 200 including the semiconductor layers 220, 240 and 260 and the ITO layer 290. At least a portion of the transparent insulation layer 410 is positioned between the wiring 400 and the light emitting cell 200 to electrical isolate them from each other. Further, the transparent insulation layer 410 has openings 412 and 414 above the aforementioned contact groove 294 and the N-type contact pad 222, respectively, to which the wiring 400 is connected. Although a silicon oxide film ($SiO_2$) is used as the transparent insulation layer 410 in this embodiment, the present invention is not limited thereto. That is, the transparent insulation layer may be formed of any other transparent insulating materials.

Meanwhile, the P-type semiconductor layer 260 may further include a current blocking layer 262 around the bottom of the contact groove 294. The current blocking layer 262 is formed in a limited region of the P-type semiconductor layer 260 brought into contact with the contact connection portion 402 of the wiring 400. The current blocking layer 262 is formed due to the change in an electrical property of a portion of the P-type semiconductor layer 260 by means of damage during the dry etching process of forming the aforementioned contact groove 294. Further, the current blocking layer 262 serves to cut off a current between the one end of the wiring 400 and the P-type semiconductor layer 260 such that a current can be widely diffused into the ITO layer 290.

In the light emitting diode 1 according to this embodiment of the present invention so configured, a contact area between the wiring 400 and the ITO layer 290 can be increased while not greatly reducing the light emitting area of the ITO layer 290. Particularly, since the contact connection portion 402, which is a portion of the wiring 400, is brought into contact with the inner circumferential surface of the contact groove 294 of the ITO layer 290 and the inner circumferential surface of the contact groove 294 is a position where a current can be easily diffused into the ITO layer 290, the connection structure for the contact groove 294 and the wiring 400 can further increase the efficiency of current diffusion into the ITO layer 290 from the wiring 400.

In addition, the AC light emitting diode 1 according to this embodiment of the present invention may further comprise an insulating protection film 420 capable of covering the wiring 400 and the transparent insulation layer 410. The insulating protection film 420 prevents the wirings 400 from being contaminated with moisture and from being damaged due to an external pressure.

Hereinafter, a method of fabricating a light emitting diode according to an embodiment of the present invention will be described with reference to FIGS. 2 to 9.

Figure 2:
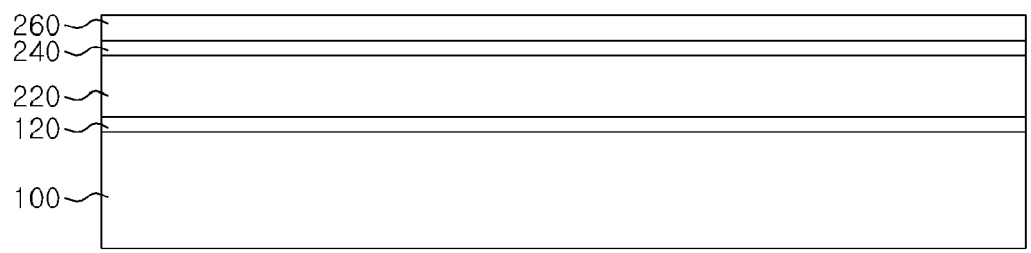
FIGS. 2 to 9 are sectional views illustrating a method of fabricating the light emitting diode shown in FIG. 1.

Referring to FIG. 2, a buffer layer 120 is first formed on a substrate 100. An N-type semiconductor layer 220, an active layer 240 and a P-type semiconductor layer 260 are sequentially formed on the buffer layer 120. The buffer layer 120 and the semiconductor layers 220, 240 and 260 may be formed using metal organic chemical vapor deposition (MOCVD), molecular beam epitaxy (MBE), hydride vapor phase epitaxy (HVPE) or the like. Further, the semiconductor layers 220, 240 and 260 may be consecutively formed within the same process chamber.

At this time, the buffer layer 120 may be formed of an insulating material film such as an AlN or semi-insulating GaN layer. In some cases, however, the buffer layer may be formed of a conductive material film, e.g. an N-type GaN layer or undoped GaN layer. That is, in a case where the substrate 100 is an insulating substrate made of sapphire, the buffer layer may be formed of a conductive material film.

Figure 3:
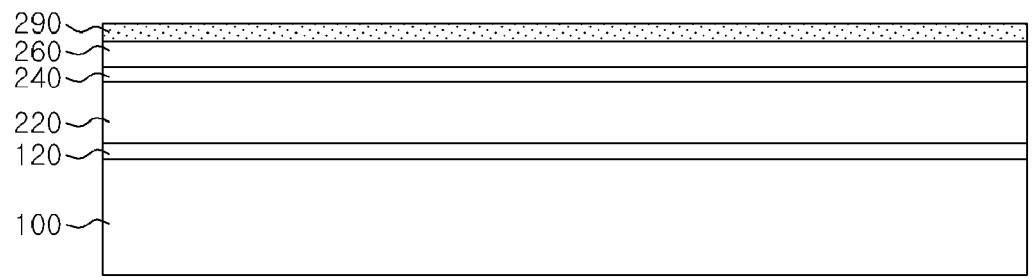

Referring to FIG. 3, an ITO layer 290 is formed on the P-type semiconductor layer 260. Before the ITO layer 290 is formed, a process of forming a tunnel structure made of a delta doping layer with a thickness of about 5 to 50 may be performed to form an ohmic contact between the ITO layer 290 and the P-type semiconductor layer 260. Further, the ITO layer 290 may be formed after a mesa formation process to be described later.

Figure 4:
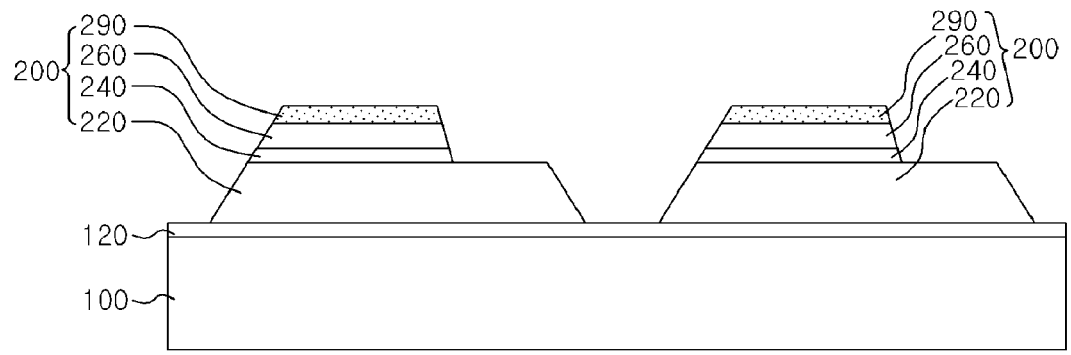

Referring to FIG. 4, a plurality of light emitting cells 200 are formed on the substrate 100 through a mesa formation process. This process is performed through an etching method using light exposure. The plurality of light emitting cells 200 each having the N-type semiconductor layer 220, the active layer 240, the P-type semiconductor layer 260 and the ITO layer 290 are formed on the substrate 100 to be spared apart from one another. Further, portions of the P-type semiconductor layer 260 and the active layer 240 are removed to form a region, i.e. a contact region, where a portion of a top surface of the N-type semiconductor layer 220 is exposed upwardly to the outside.

Figure 5:
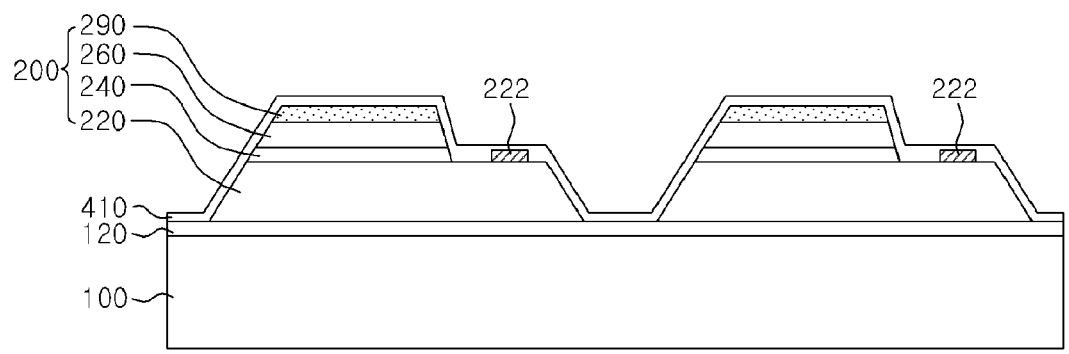

Referring to FIG. 5, an N-type contact pad 222 is formed in the contact region of the N-type semiconductor layer 220. Then, a transparent insulation layer 410 is deposited on the substrate 100 on which the light emitting cells 200 are formed. The transparent insulation layer 410 covers the side and top surfaces of the light emitting cells 200 and covers the whole of the substrate 100 between the light emitting cells 200. Thus, the aforementioned ITO layers 290 and contact pads 222 are also covered by the transparent insulation layer 410. The transparent insulation layer 410 may be formed, for example, as a silicon oxide film using a chemical vapor deposition (CVD) method. At this time, it is preferred that the side surfaces of the light emitting cells 200 be inclined in the aforementioned mesa formation process such that the transparent insulation layer 410 can be easily covered even to the side surfaces of the light emitting cells 200.

Figure 6:
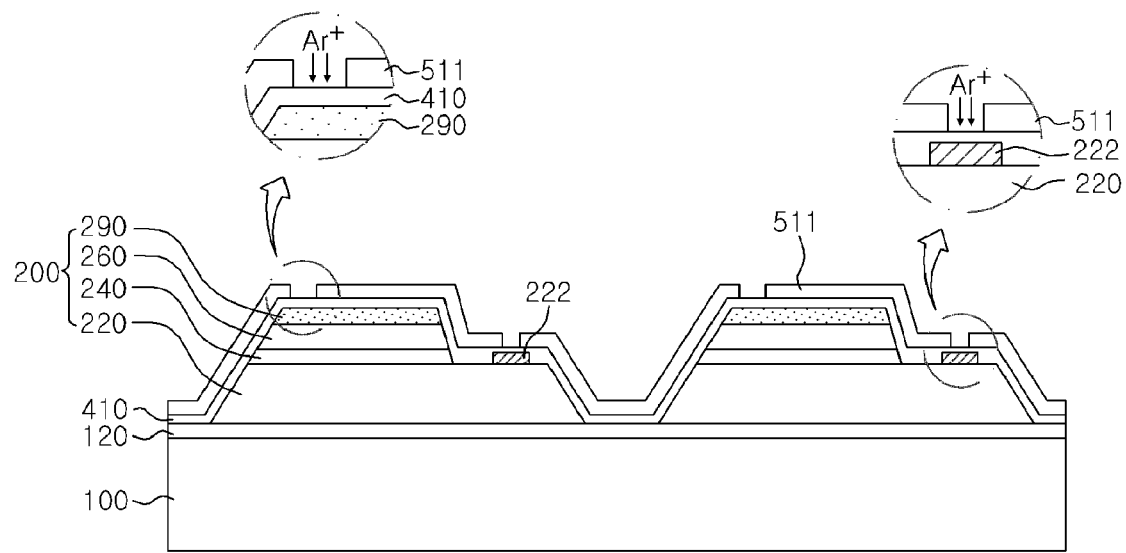
Figure 7:
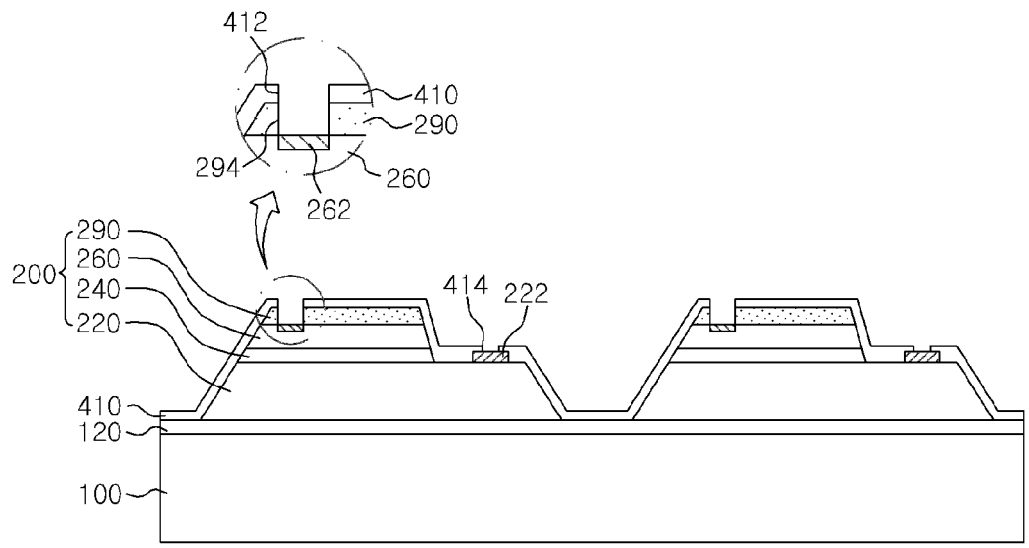

Referring to FIG. 6, a photoresist is applied onto the transparent insulation layer 410, and a process of defining a portion to be etched is performed by removing the rest portion except a portion where openings for the wiring connection will be formed. Next, as shown in FIGS. 6 and 7, first and second openings 412 and 414 are formed in the transparent insulation layer 410, and a patterning and dry etching process of forming a contact groove 294 in communication with the first opening 412 on the ITO layer 290 is performed. In this embodiment, the dry etching process is performed in such a manner that portions of the transparent insulation layer 410 and the ITO layer 290 are physically stripped by causing $Ar^+$ (inert gas) to collide against an etched surface. At this time, the contact groove 294 formed through the dry etching process is determined to have such a depth that the contact groove reaches the surface of the P-type semiconductor layer 260.

Further, if the aforementioned dry etching process is continued even after the ITO layer 290 has been etched to a degree that the contact groove 294 reaches the surface of the P-type semiconductor layer 260, a current blocking layer 262 is formed on the surface of the P-type semiconductor layer 260. The current blocking layer 262 is formed due to the change in an electrical property of a portion of the surface of the P-type semiconductor layer 260 produced when the aforementioned $Ar^+$ collides against the surface of the P-type semiconductor layer 260.

Figure 8:
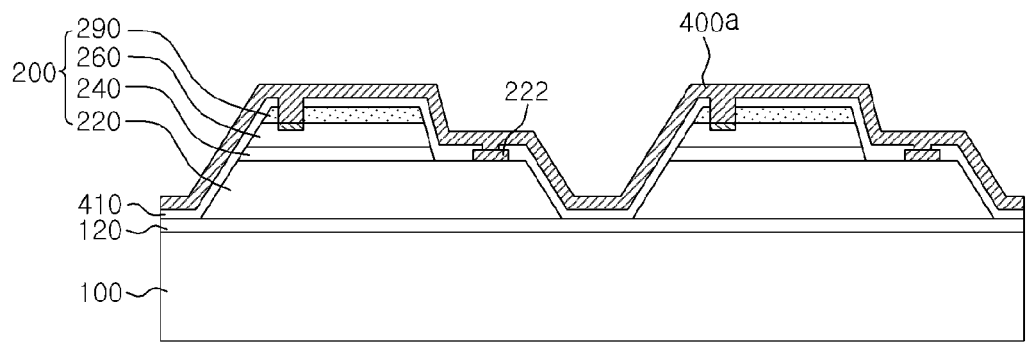
Figure 9:
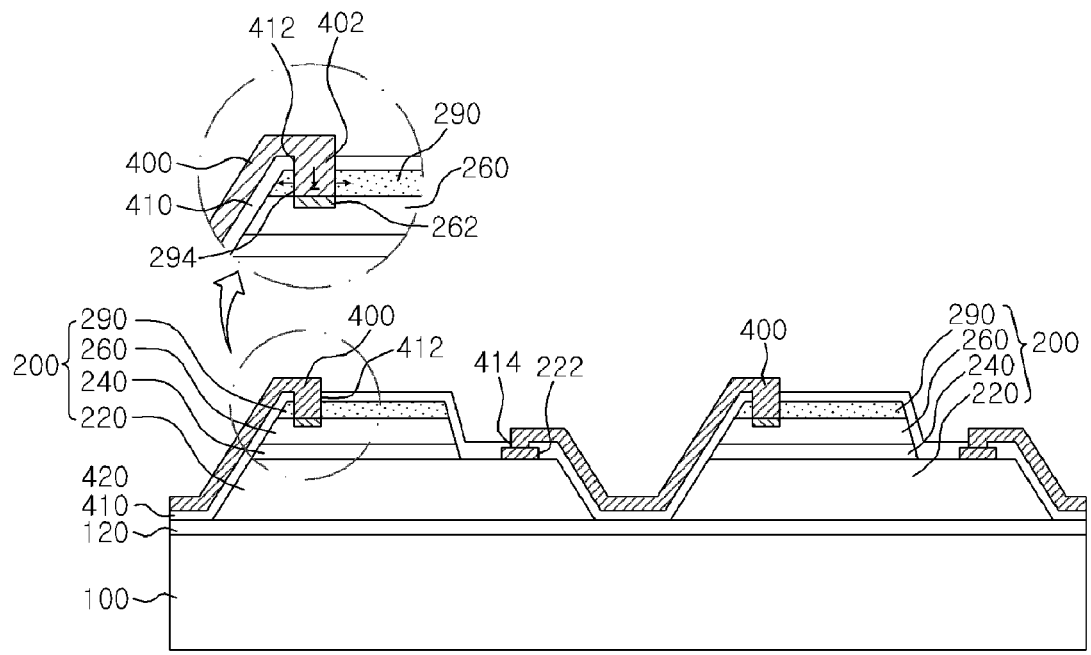

Next, a wiring connection process is performed as shown in FIGS. 8 and 9. For the wiring connection, a conductive material layer 400a that covers the light emitting cells 200 and the substrate between the light emitting cells 200 in a state where the transparent insulation layer 410 is formed on the cells and the substrate between the cells is first formed through a plating or vapor depositing method as shown in FIG. 8. Then, if a portion of the conductive material layer 400a corresponding to regions where light is emitted from the light emitting cells 200 is removed such that the light emitting regions are not covered, wirings 400 having a conductive material layer structure are formed as shown in FIG. 9.

Therefore, the wiring 400 is configured in such a manner that one end thereof, i.e. a contact connection portion 402, passes through the first opening 412 of the transparent insulation layer 410 and is then filled into the contact groove 294 in the ITO layer 290 while the other end extending from the one end passes through the second opening 414 and is then connected to the N-type contact pad 222 on the N-type semiconductor layer 220. Unlike the wiring connecting process performed in this embodiment, it is possible to form the wiring 400 in the shape shown in FIG. 9 without using a process of removing a conductive material layer. This may be implemented by previously defining a region, on which wirings will be formed, using a photoresist for forming the transparent insulation layer 410.

After all the above processes have been completed, an insulating protection film 420 that covers the wirings 400 and the transparent insulation layer 410 may be formed. The light emitting diode 1 formed with the transparent insulation layer 410 thereon is well illustrated in FIG. 1.

As described above, in the light emitting diode 1 according to the embodiment of the present invention, since the one end of the wiring 400 is widely brought into contact with an inner circumferential surface of the contact groove 294 of the ITO layer 290, a contact area between the wiring 400 and the ITO layer 290 can be greatly expanded. Further, since the wiring 400 comes into contact with the P-type semiconductor layer 260 and thus the current blocking layer 262 blocks a current from flowing into the P-type semiconductor layer at the contact portion, the efficiency of current diffusion into the ITO layer 290 can be more enhanced.

Hereinafter, a light emitting diode according to a second embodiment of the present invention will be described. When describing the light emitting diode according to the second embodiment, like reference numerals are used for elements that perform the same function as elements of the first embodiment. Therefore, descriptions in the second embodiment that overlap the aforementioned first embodiment will be omitted herein to make the subject manner of the present invention unnecessarily obscure.

Figure 10:
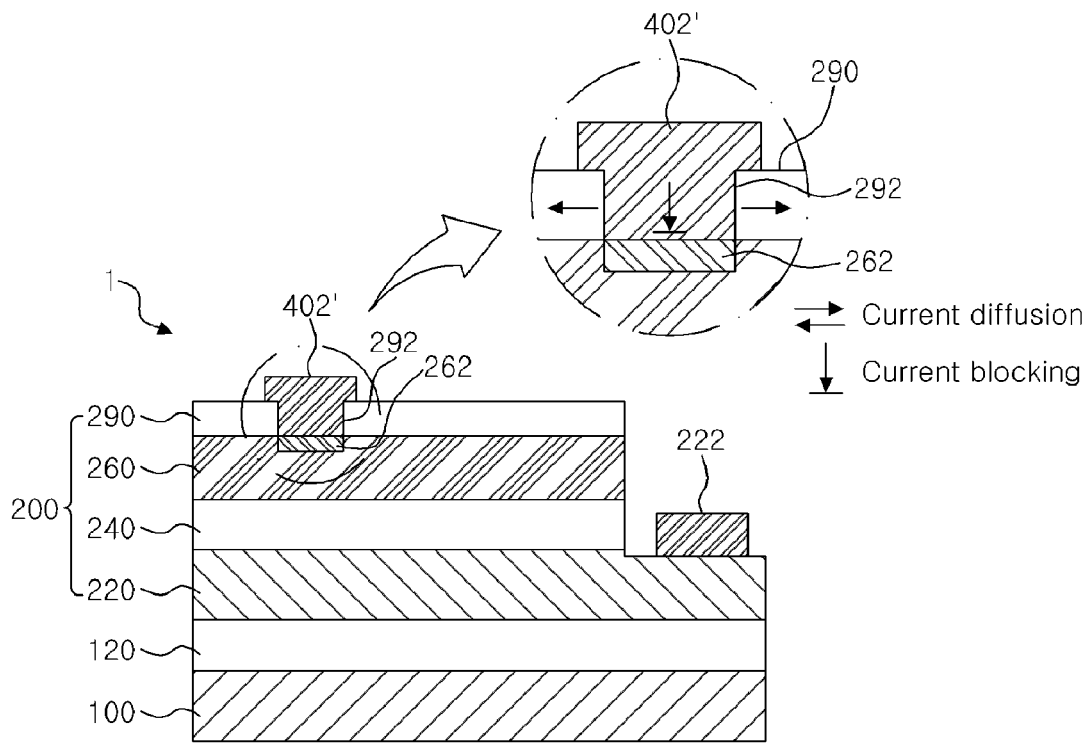
FIG. 10 is a sectional view illustrating a light emitting diode according to a second embodiment of the present invention.

FIG. 10 is a sectional view illustrating a light emitting diode according to a second embodiment of the present invention.

As shown in FIG. 10, the light emitting diode 1 according to this embodiment comprises a substrate 100 serving as a base and a light emitting cell 200 formed on the substrate 100. Similarly to the previous embodiment, the light emitting cell 200 has a structure in which an N-type semiconductor layer 220, an active layer 240 and a P-type semiconductor layer 260 are sequentially laminated. The active layer 240 is restrictively formed on a certain region of the N-type semiconductor layer 220 through the aforementioned mesa formation process, and the P-type semiconductor layer 260 is formed on the active layer 240. Thus, a certain region of the N-type semiconductor layer 220 is bonded to the active layer 240, whereas the rest of the region is exposed as a contact region where an N-type contact pad 222 is formed. Further, an ITO layer 290 is formed on the P-type semiconductor layer 260.

According to the second embodiment, a P-type contact pad 402 is provided on a top surface of the ITO layer 290 to serve as a contact connection portion connected to a wiring (not shown). The P-type contact pad 402 is a portion connected to one end of the wiring through wire bonding. The P-type contact pad 402 is filled in a contact groove 292 of the ITO layer 290 to allow the wiring to be connected to the ITO layer 290, similarly to the contact connection portion 402 (see FIG. 1) which was formed as a portion of the wiring as described in the previous embodiment.

The connection structure for the P-type contact pad 402 and the ITO layer 290 according to this embodiment can minimize the reduction in a light emitting area of the ITO layer 290 and increase the contact area between the ITO layer 290 and the P-type contact pad 402' In particular, the connection structure can enhance the efficiency of current diffusion into the ITO layer 290 from the P-type contact pad 402' To this end, the contact groove 292 is formed on the top surface of the ITO layer 290, particularly at a place where the P-type contact pad 402' will be formed.

Similarly to the previous embodiment, the contact groove 292 extends from the ITO layer 290 to the surface of the P-type semiconductor layer 260. Further, a portion of the P-type contact pad 402 is filled into the contact groove 292 through a plating or vapor depositing method, for example. Furthermore, the P-type contact pad 402 filled into the contact groove 294 is configured in such a manner that an upper portion thereof comes into contact with a top surface of the ITO layer 290 outside of the contact groove 292 and a lower portion thereof comes into contact with an inner circumferential surface of the ITO layer 290 inside of the contact groove 294.

Accordingly, the light emitting diode according to this embodiment can increase a contact area between the P-type contact pad 402 and the ITO layer 290 while not significantly reducing a light emitting area of the ITO layer 290. Moreover, the efficiency of current diffusion into the ITO layer 290 can be more enhanced due to a structure in which the P-type contact pad 402 is simultaneously brought into contact with the top surface of the ITO layer 290 and the inner circumferential surface of the contact groove 292.

Similarly to the previous embodiment, the P-type semiconductor layer 260 according to this embodiment also includes a current blocking layer 262. The current blocking layer 262 is formed in a limited region of the P-type semiconductor layer 260 brought into contact with the aforementioned P-type contact pad 402. As described in the previous embodiment, the current blocking layer 262 is formed due to change in an electrical property of a portion of the P-type semiconductor layer 260 during a dry etching process for forming the contact groove 292.

Hereinafter, a method of fabricating the aforementioned light emitting diode will be described with reference to FIGS. 11 to 16.

Figure 11:
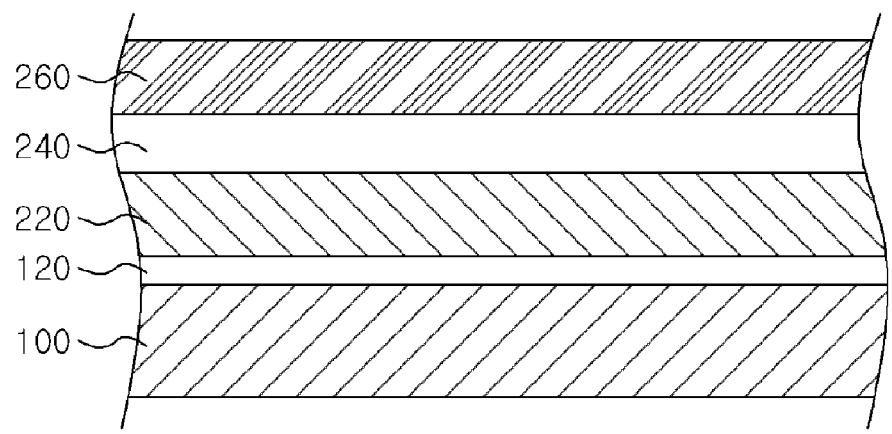
FIGS. 11 to 16 are sectional views illustrating a method of fabricating the light emitting diode shown in FIG. 10.
Figure 12:
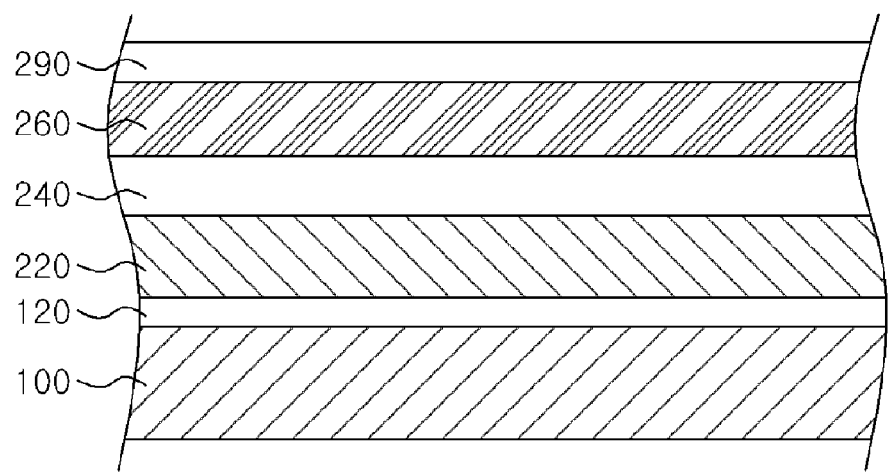

Referring to FIG. 11, a buffer layer 120 is formed on a substrate 100. An N-type semiconductor layer 220, an active layer 240 and a P-type semiconductor layer 260 are sequentially formed on the buffer layer 120. Next, an ITO layer 290 is formed on a top surface of the aforementioned P-type semiconductor layer 260 as shown in FIG. 12.

Figure 13:
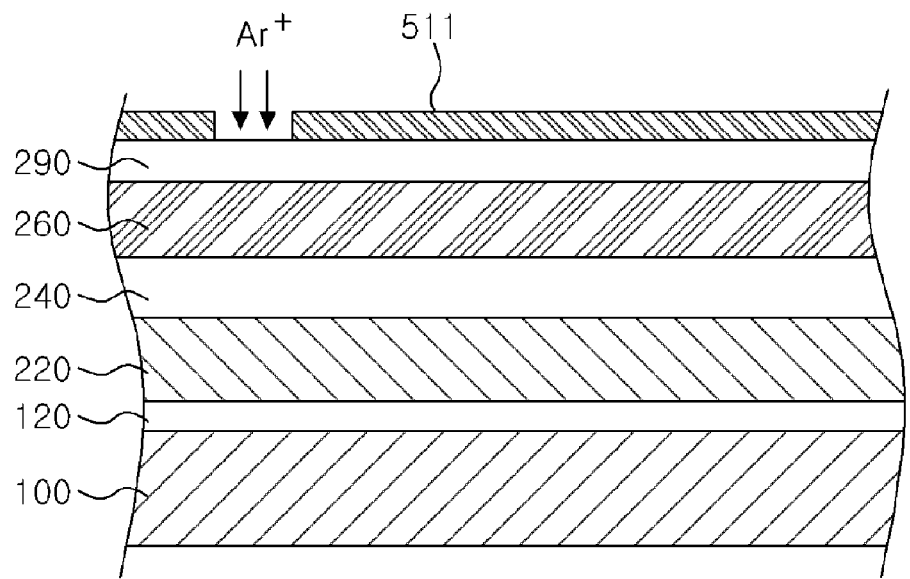
Figure 14:
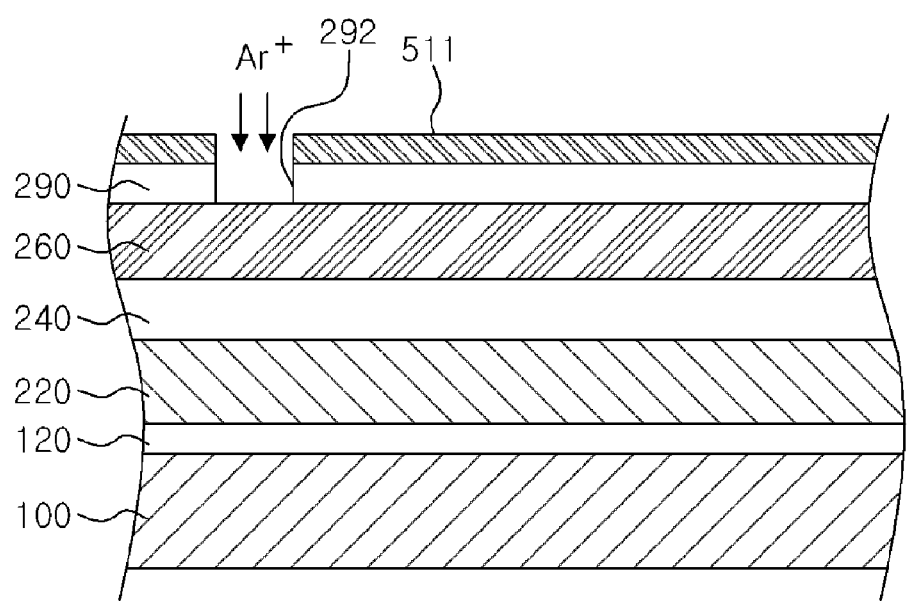
Figure 15:
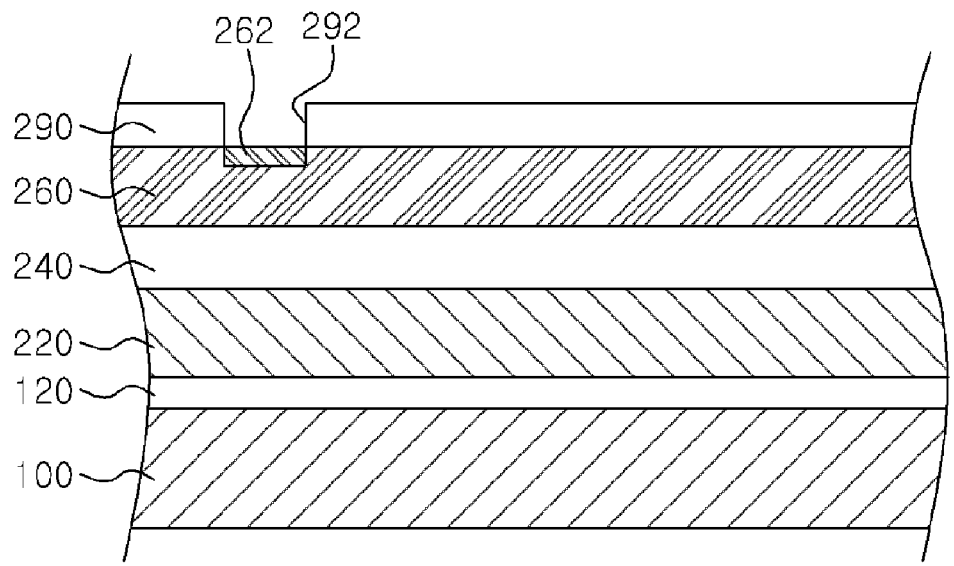

Referring to FIGS. 13 to 15, a contact groove 292 which will be filled with a P-type contact pad is formed in the ITO layer 290. Although it is described in this embodiment that the contact groove 292 is first formed and a mesa formation process of exposing a portion of the N-type semiconductor layer 220 is then performed, a contact groove may be formed after performing a mesa formation process.

First, a photoresist 511 is applied on a top surface of the ITO layer 290 to define a position where the contact groove 292 will be formed, and the contact groove 292 extending from the ITO layer 290 to the surface of the P-type semiconductor layer 260 is then formed through a dry etching process. If the aforementioned dry etching process is continued, a current blocking layer 262 is formed on the surface of the P-type semiconductor layer 260 as shown in FIG. 15. The current blocking layer 262 is formed due to the change in an electrical property of a portion of the surface of the P-type semiconductor layer 260 produced when the aforementioned Ar$^+$ collides against the surface of the P-type semiconductor layer 260, as already described in the previous embodiment.

Figure 16:
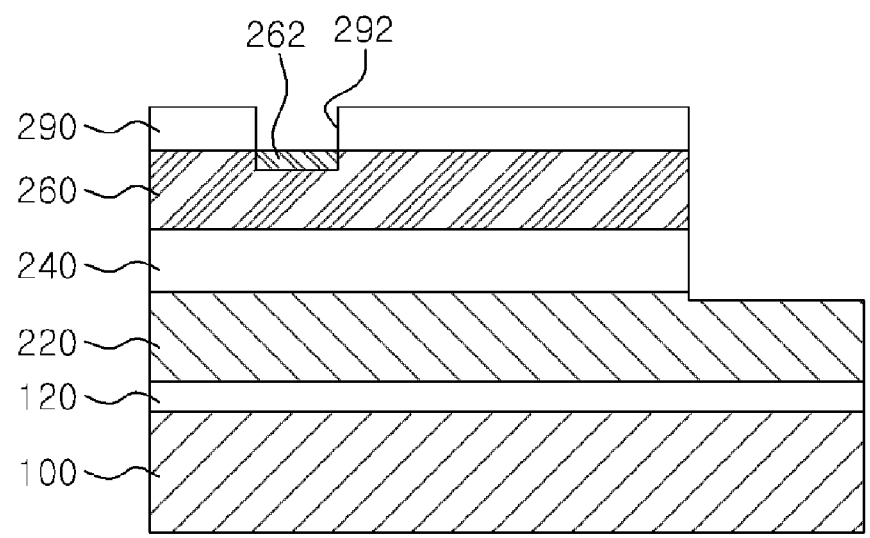

Next, a mesa formation process of providing a place where an N-type contact pad will be formed is performed. The process is performed in such a manner that the ITO layer 290, the P-type semiconductor layer 260 and the active layer 240 are partially etched to provide a place where the N-type contact pad will be formed, so that a portion of the N-type semiconductor layer 220 is exposed to the outside as shown in FIG. 16.

Then, a process of forming N-type and P-type contact pads 222 and 402 through a plating or vapor depositing method is performed. As shown in FIG. 10, the N-type and P-type contact pads 222 and 402 are formed on the top surface of the ITO layer 290 and the contact region of the N-type semiconductor layer 220, respectively. The order of forming the contact pads can be selected by a manufacturer, and thus, it does not limit the present invention.

According to the preferred embodiment of the present invention, the P-type contact pad 402 comprises the lower portion filled in the contact groove 292 and the upper portion formed larger than the lower portion to cover the contact groove 292. Since the lower portion of the P-type contact pad 402 is brought into contact with an inner circumferential surface of the contact groove 292 of the ITO layer 290 and the upper portion of the P-type contact pad 402 is brought into contact with the top surface of the ITO layer 290, the contact area between the P-type contact pad 402 and the ITO layer 290 can be greatly expanded.

Meanwhile, the aforementioned dry etching process of forming the contact groove 292 serves to form the current blocking layer 262 and also to clearly remove the photoresist coated on the inner circumferential surface of the contact groove 292. A wet etching process cannot remove a large amount of photoresist residual from an etching surface, whereas a dry etching process can clearly remove the photoresist residual from the etching surface.

The photoresist residual remaining on the inner circumferential surface of the contact groove of the ITO layer 290 is very difficult to remove after the etching process. If a contact pad or one end of the wiring is filled in the contact groove 292 where the photoresist residual remains, the photoresist residual may hinder normal current diffusion into the ITO layer 290 from the wiring and/or the P-type contact pad and thus can greatly lower the luminance of a light emitting diode.

Figure 17:
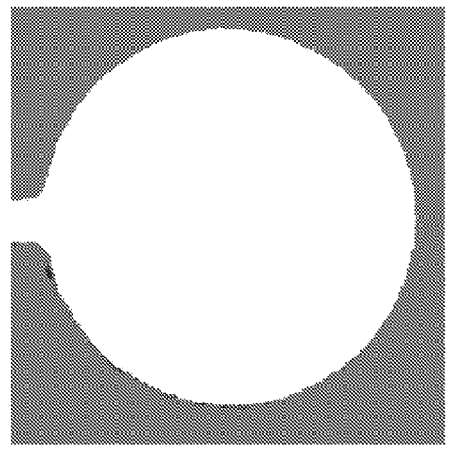
FIGS. 17 and 18 are views showing real photographs of a contact groove formed through dry etching according to the embodiments of the present invention and a contact groove formed through wet etching as a comparative example, respectively.
Figure 18:
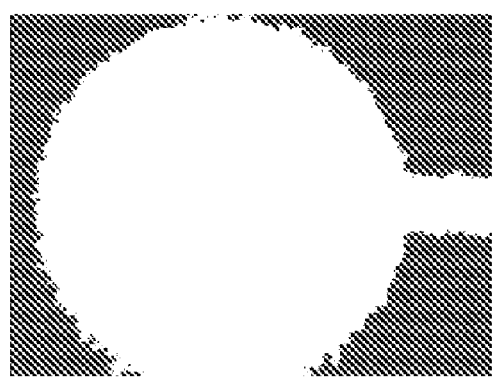

FIGS. 17 and 18 are photographs which compare a contact groove formed through a dry etching process and a contact groove formed through a wet etching process. It can be seen that a large amount of photoresist residual remains at an edge of a contact groove formed through the wet etching process as shown in FIG. 18 while photoresist residual hardly remains in a contact groove formed through the dry etching process as shown in FIG. 17.

Since an ITO layer with excellent light transmittance is used as a transparent electrode layer according to the present invention, a current property considered as a problem of the ITO layer is enhanced, so that a light emitting diode with improved luminance and light emitting performance can be implemented.

The invention claimed is:

1. A light emitting device, comprising:
a substrate;
a plurality of light emitting cells arranged on the substrate, wherein each light emitting cell comprises:
   a first semiconductor layer and a second semiconductor layer;
   an inclined surface; and
   a current diffusion layer arranged on the second semiconductor layer;
a first insulation layer arranged on each light emitting cell;
a conductive material arranged on the first insulation layer to couple two of the light emitting cells; and
a second insulation layer arranged on the conductive material,
wherein the current diffusion layer comprises an opening and the conductive material is arranged in the opening, and the conductive material is coupled to the second semiconductor layer of each light emitting cell through the current diffusion layer.

2. The light emitting device of claim 1, wherein the substrate is exposed between the plurality of light emitting cells, and the first insulation layer is arranged on the exposed portion of the substrate.

3. The light emitting device of claim 1, wherein the conductive material is coupled to the first semiconductor layer of one of the two light emitting cells through a first opening formed in the first insulation layer, and
wherein the conductive material is coupled to the second semiconductor layer of the other of the two light emitting cells through a second opening formed in the first insulation layer.

4. The light emitting device of claim 1, wherein the conductive material physically contacts the current diffusion layer and the second semiconductor layer.

5. The light emitting device of claim 1, wherein the second insulation layer is arranged directly on both the first insulation layer and the conductive material.

6. The light emitting device of claim 1, wherein the second insulation layer corresponds to a contour of each light emitting cell.

7. The light emitting device of claim 1, further comprising:
an insulation buffer layer arranged between the substrate and each light emitting cell.

8. The light emitting device of claim 7, wherein the substrate comprises a conductive substrate.

9. The light emitting device of claim 1, wherein the inclined surface comprises a side surface of the first semiconductor layer.

10. The light emitting device of claim 9, wherein the inclined surface comprises a side surface of the second semiconductor layer.

11. The light emitting device of claim 1, wherein the first insulation layer comprises $SiO_2$.

12. The light emitting device of claim 1, wherein the second insulation layer comprises a moisture proof material.

* * * * *